United States Patent [19]

Ruetz

[11] Patent Number: 5,581,216
[45] Date of Patent: Dec. 3, 1996

[54] LOW JITTER VOLTAGE CONTROLLED OSCILLATOR (VCO) CIRCUIT

[75] Inventor: John E. Ruetz, San Bruno, Calif.

[73] Assignee: IC Works, Inc., San Jose, Calif.

[21] Appl. No.: 377,269

[22] Filed: Jan. 24, 1995

[51] Int. Cl.⁶ ............... H03B 5/24; H03L 7/099
[52] U.S. Cl. ............. 331/57; 331/34; 331/177 R; 331/186
[58] Field of Search ............... 331/34, 57, 111, 331/175, 177 R, 185, 186, DIG. 3; 326/112–123; 327/266, 274, 280, 287

[56] References Cited

U.S. PATENT DOCUMENTS

| | | | |
|---|---|---|---|
| 5,081,429 | 1/1992 | Atriss et al. | 331/57 |
| 5,175,512 | 12/1992 | Self | 331/57 |
| 5,355,097 | 10/1994 | Scott et al. | 331/1 A |
| 5,440,277 | 8/1995 | Ewen et al. | 331/57 X |
| 5,485,126 | 1/1996 | Gersbach et al. | 331/57 |

*Primary Examiner*—David Mis
*Attorney, Agent, or Firm*—Oblon, Spivak, McClelland, Maier & Neustadt P.C.

[57] ABSTRACT

A voltage controlled oscillator circuit includes a predetermined number of interconnected differential comparator cells having source connected p-channel and n-channel transistors, a biasing transistor connected to the sources of the p-channel or n-channel transistors, and clamping circuits connected to said first and second n-channel transistors. The voltage controlled oscillator circuit further includes filter circuitry for filtering the input currents to the biasing transistor.

3 Claims, 6 Drawing Sheets

५,५८१,२१६

LOW JITTER VOLTAGE CONTROLLED OSCILLATOR (VCO) CIRCUIT

CROSS-REFERENCE TO RELATED APPLICATIONS

This application is related to a co-pending patent application filed on the same day herewith and having the same inventorship as herein, and respectively entitled "SLOW TRANSITION TIME PHASE FREQUENCY DETECTOR AND METHOD." This co-pending patent application has Ser. No., 08/377,153. This patent application is assigned to the same assignee as herein, and is incorporated herein by reference in its entirety.

TECHNICAL FIELD

The present invention relates to low jitter voltage controlled oscillator circuits and methods.

BACKGROUND OF THE INVENTION

Ring oscillators, particularly fully differential comparator based ring oscillators are difficult to bias and to operate stably with low jitter. Jitter generally means irregularities of the output frequency signal from the voltage controlled oscillator, typically expressed in an output voltage signal, vco. One kind of irregularity is time variation between the moment when successive output cycles reach a particular level. Because of problems of jitter and other signal difficulties, complex circuitry has been developed to accomplish the biasing of differential comparator circuitry in ring oscillators. The design and manufacture of such complex circuitry is expensive. Additionally, some current biasing approaches for differential comparator ring oscillators have employed high transistor count circuitry with high noise injection levels due to amplifier gain incident to comparator biasing. Further, with regulated power supplies, operation of differential comparator ring oscillators over a broad frequency range is difficult.

Accordingly, it is desirable to develop low transistor count ring oscillator circuits which avoid complex biasing schemes in the case of fully differential circuitry, particularly in implementations relying upon a regulated power supply.

SUMMARY OF THE INVENTION

According to the present invention, a simple, low transistor count oscillator using a filtered regulator power supply includes a fully differential, self-biasing ring of comparators to produce low jitter, low noise operation over a wide frequency range. A voltage oscillator circuit includes a predetermined number of interconnected differential comparator cells having source connected p-channel and n-channel transistors, a biasing transistor connected to the sources of the p-channel or n-channel transistors, and clamping transistors respectively connected in parallel with said first and second n-channel transistors. The voltage oscillator circuit further includes filter circuitry for filtering the input currents to the biasing transistor.

DETAILED DESCRIPTION OF THE PREFERRED EMBODIMENTS

Figure 1:
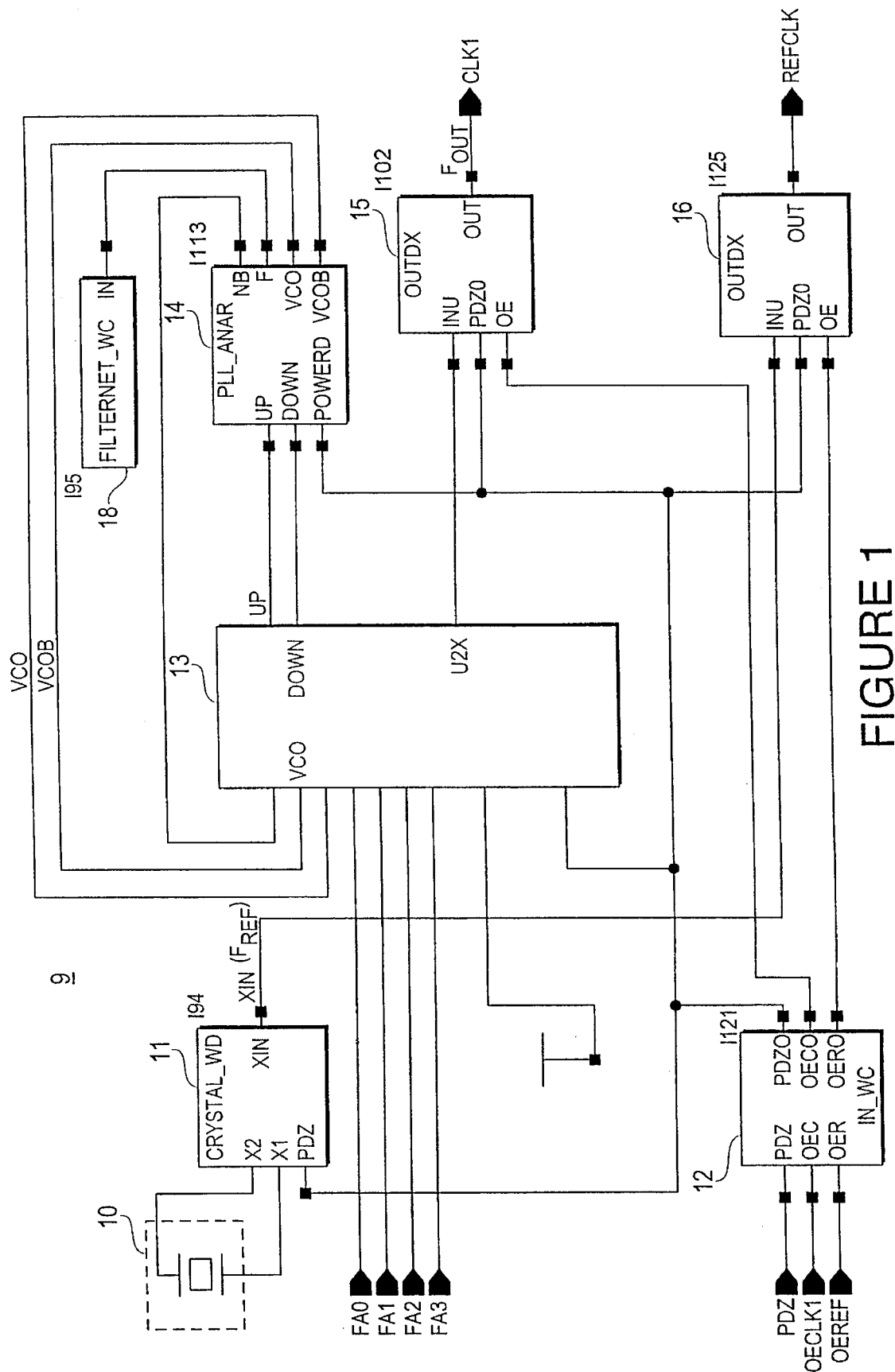
FIG. 1 is a circuit diagram of an electric circuit system including a phase lock loop and a voltage controlled oscillator circuit according to the present invention.

FIG. 1 is a diagram of an electric circuit system 9 including a crystal 10, a crystal interface circuit 11, an input buffer 12, a phase lock loop subcircuit 13 (DIG1394_WD), an analog circuit 14 (PLL$_{13}$ ANAR), output buffer blocks 15–16, and a filter circuit 18. Crystal 10 produces a reference frequency (Fref) of 14.31818 MHz for example and is connected at first and second inputs (i.e., x1 and x2) of crystal interface circuit 11. Filter circuit 18 is connected to analog circuit 14 for converting the output of the charge pump (not shown) into a slowly varying voltage as an input to a voltage controlled oscillator (VCO) circuit within analog circuit 14. The vco signal is an output from analog circuit 14. Analog circuit 14 is connected to phase lock loop subcircuit 13 both to receive vco and Fref signals. Crystal interface circuit 11 produces an output signal at xin at a frequency equaling Fref. Output buffer blocks 15 and 16 can be connected to drive predetermined external loads (not shown) at selected frequencies given by the equation, Fout= (Fref*M*P)/(N*O), where M is a feedback divider value, N is an input divider value, and O is an output divider value.

Figure 2:
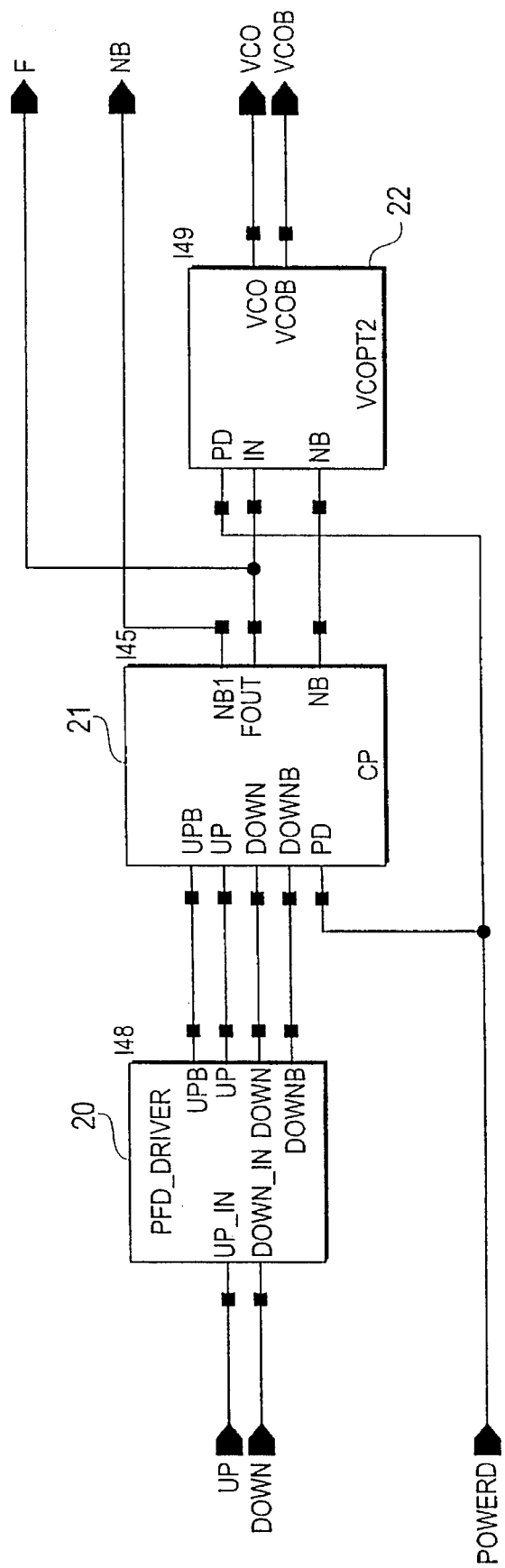
FIG. 2 is a circuit diagram of an analog circuit including a voltage controlled oscillator circuit according to the present invention.

FIG. 2 is a circuit diagram of analog circuit 14 including a driver circuit 20, a current pulse circuit 21, and a voltage controlled oscillator circuit 22 according to the present invention. In particular, driver circuit 20 of analog circuit 14 receives pulses (up and down) indicating the difference between the input signals vco and xin to phase lock loop subcircuit 13. Driver circuit 20 includes inverter circuitry to interface phase lock loop subcircuit 13 with current pulse circuit 21. Analog circuit further sends digital frequency signals into analog form with filter circuit 18 along signal line f connected to the four output of current pulse circuit 21 and the in input of voltage controlled oscillator circuit 22. Current pulse circuit 21 connects driver circuit 20 with voltage controlled oscillator circuit 22. Current pulse circuit 21 converts up and down signals into proportional current pulses for processing by filter circuit 18 which filters the proportional current pulses into a dc level for provision to voltage controlled oscillator circuit 22. Voltage controlled oscillator circuit 22 converts the received dc level into a frequency depending on the dc level.

Figure 3:
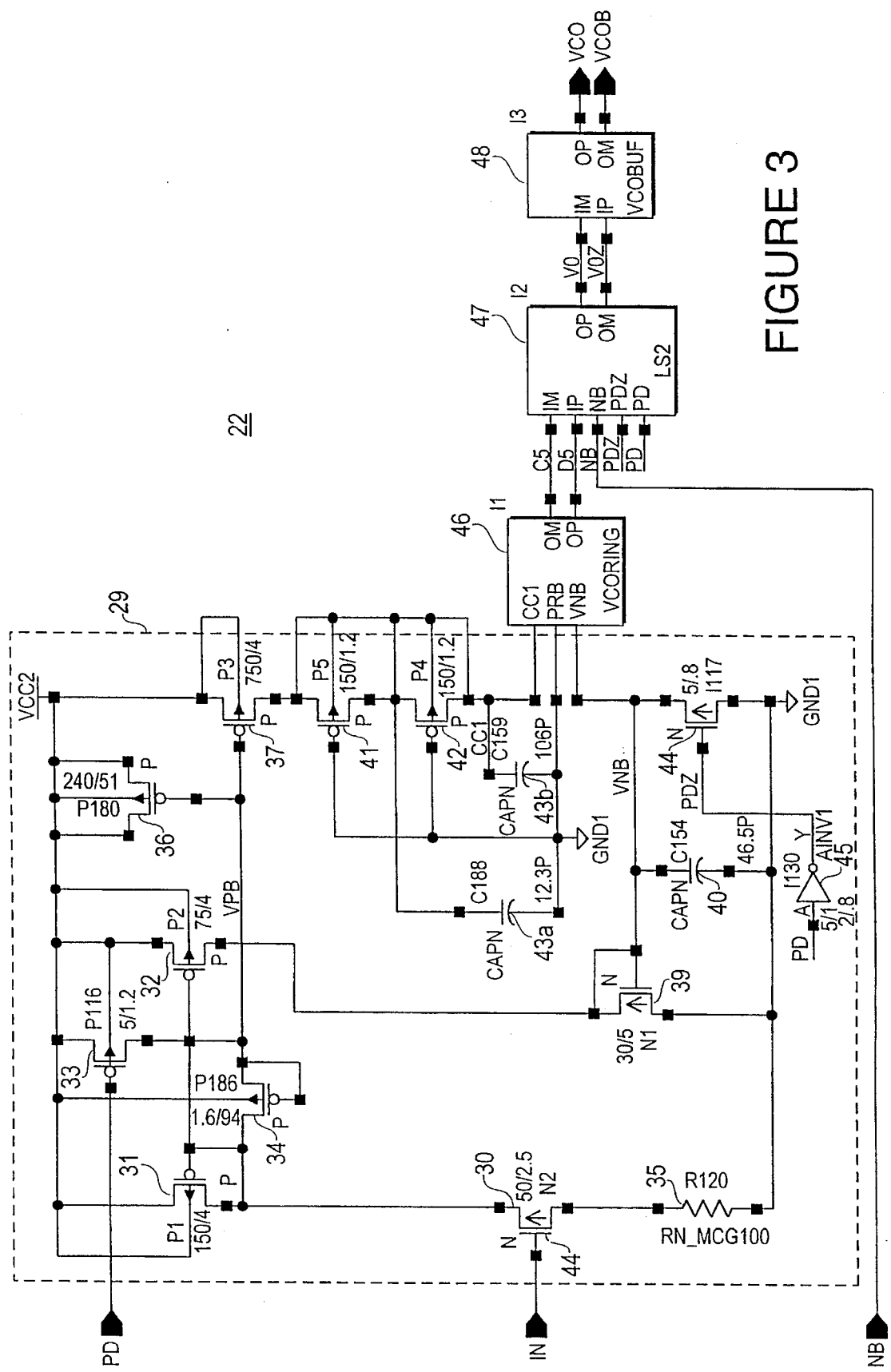
FIG. 3 is a circuit diagram of voltage controlled oscillator circuit including a ring oscillator circuit according to the present invention.

FIG. 3 is a circuit diagram of voltage controlled oscillator circuit 22 according to the present invention. In particular, voltage controlled oscillator circuit 22 includes a biasing circuit 29 including input transistor 30, current mirror transistor 31, transistor 32, biasing transistors 33 and 34, resistor 35, transistor 36, current mirror transistor 37, current mirror transistor 39, capacitor 40, transistors 41 and 42, capacitor 43, transistor 44, and inverter 45. Voltage controlled oscillator circuit 22 further includes a ring oscillator circuit 46, a output drive circuit 47, and a buffer circuit 48 including conventional inverter circuitry. Biasing circuit 29 receives an input analog frequency signal from filter circuit 18 and drives ring oscillator circuit 46 which in turn controls output drive circuit 47. Ring oscillator circuit 46 produces output signals om and op which are provided to output drive circuit 47 for translation into CMOS signals. The output of output drive circuit 47 is connected to buffer circuit 48. Biasing circuit 29 is controlled by the input voltage received at its in pin. The current Iin at the in pin is determined in part by resistor 35 which is connected between ground and n-channel transistor 30 which has its gate connected to the in pin, and by the input voltage Vin less Vgsn2, i.e., Iin=R120/(Vin−Vgsn2). The input current Iin is mirrored by current mirror transistor 31 to transistors 32 and 37. Transistors 34 and 36 are connected at their gates to node vpb to provide filtering and noise immunity at respective nodes vpd and vcc2. Additional filtering is provided at node vnb by capacitor 40 to reduce and remove noise and to keep the bias voltage vnb stable. The voltage vnb is one of the key voltages affecting the operation of ring oscillator circuit 46. Another key factor influencing operation of ring oscillator circuit 46 is the current through transistor 37 which is filtered through transistors 41 and 42 and capacitors 43a and 43b. The current passing into pin cc1 is Iin*5. Ring oscillator circuit 46 is current controlled and functions by increasing its frequency when a larger current is input to the cc1 node. This causes the OM and OP outputs to toggle at higher frequencies. The cc1 voltage will generally rise as the current through transistor 37 rises.

Figure 4:
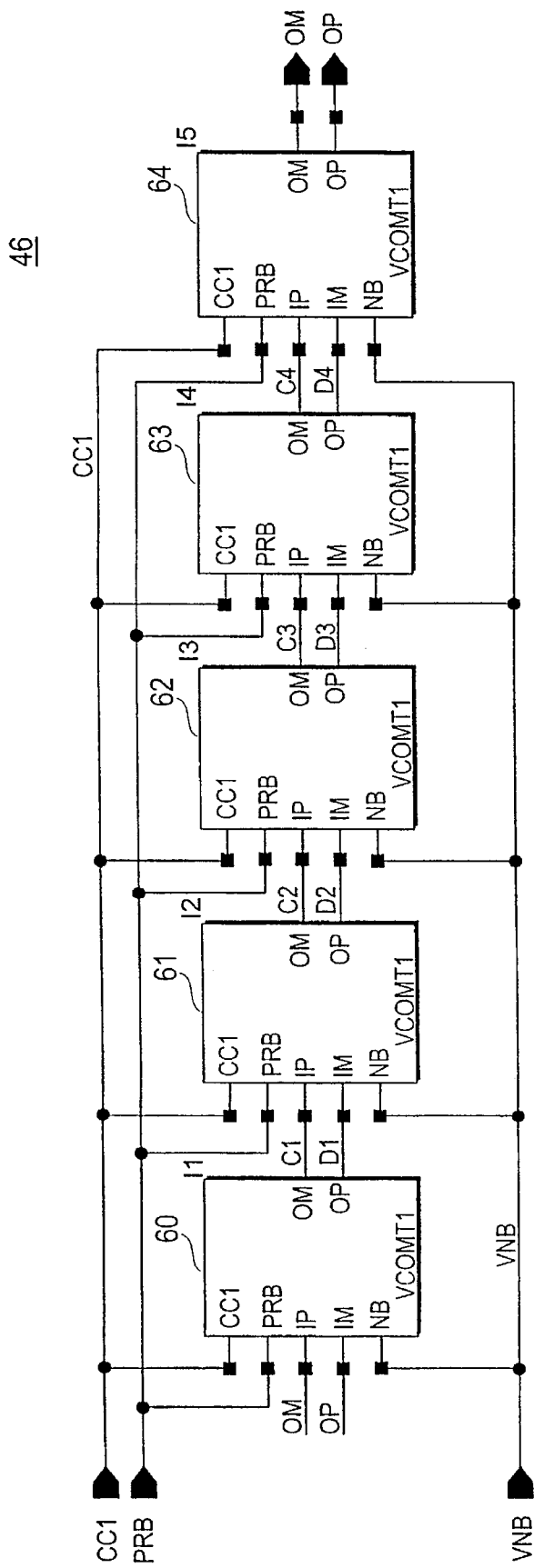
FIG. 4 is a circuit diagram of a ring oscillator circuit including a plurality of comparator cells according to the present invention.
Figure 5:
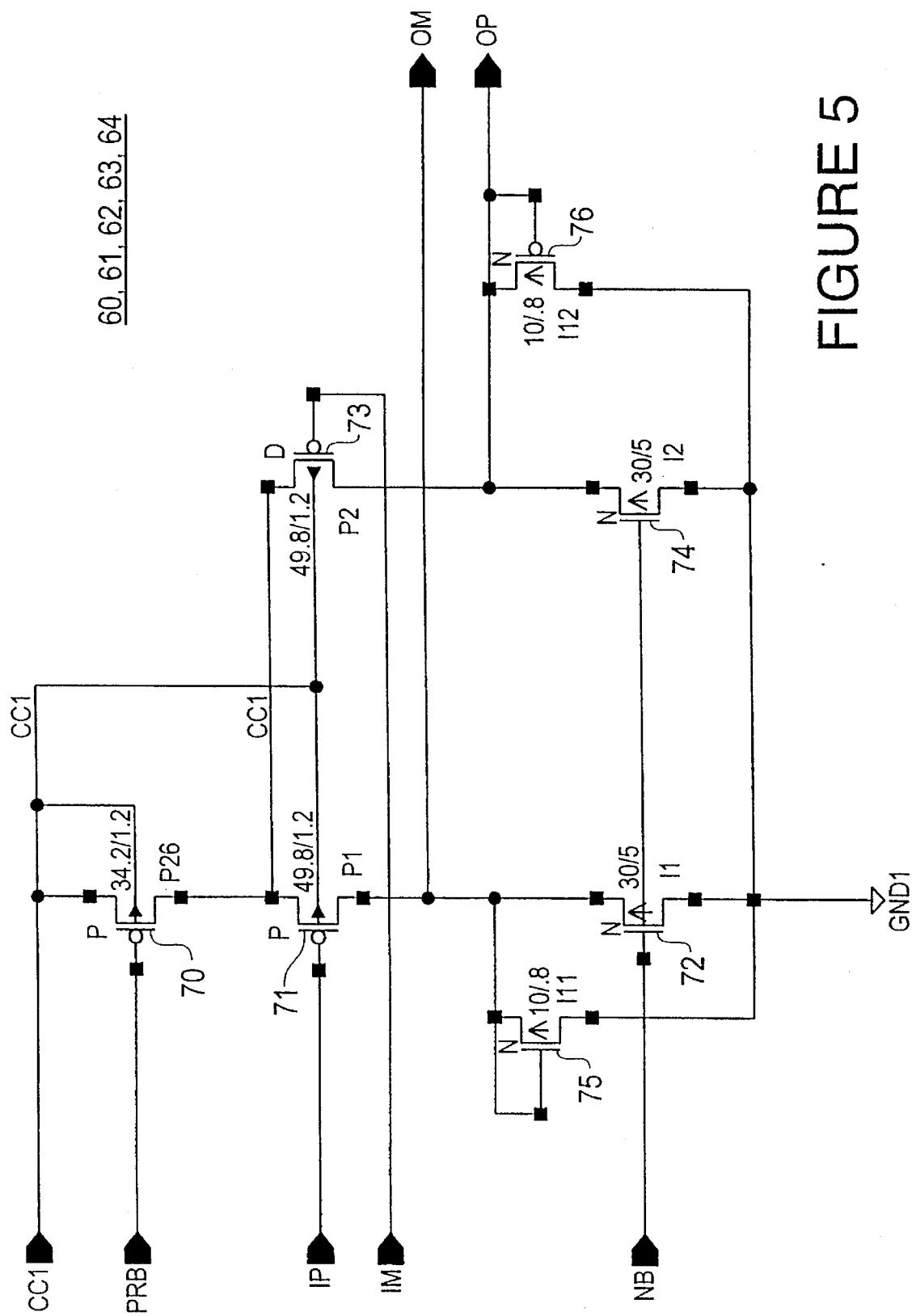
FIG. 5 is a circuit diagram of a comparator cell according to the present invention.

FIG. 4 is a circuit diagram of ring oscillator circuit 46 according to the present invention. In particular, ring oscillator circuit 46 includes a plurality of comparator cells respectively 60 through 64 connected in series beginning with comparator cell 60 and ending with comparator cell 64, according to one embodiment. Comparator cells 60–64 are similarly connected except for outputs om and op which drive output drive circuit 47. FIG. 5 is a circuit diagram of a typical one of comparator cells 60–64 according to the present invention. The selected comparator cell includes biasing transistor 70, first through fourth differential transistor 71 through 74, and first and second clamping transistors 75 and 76. Each comparator cell 60–64 is driven by first and second input signals which are the output signals respectively om and op from an adjacent comparator cell in ring oscillator circuit 46. The current comparator cell output signal om is connected to the drains of differential transistors 71 and 72. The current comparator cell output signal op is connected to the drains of differential transistors 73 and 74 and gate drain connected clamping transistor 76. Transistors 72 and 74 are connected to the nb input of respective comparator cells 60–64 and subject to a bias current of Iin/2. The total theoretical bias current through both transistors 72 and 74 is accordingly Iin. The current entering all five cc1 nodes in ring oscillator circuit 47 is 5*Iin. Consequently, the total current entering a particular comparator cell is 5*Iin/5, or Iin, which passes through transistor 70. In actual operation, the total bias current through both transistors 72 and 74 is less than the theoretical Iin, because rather than both transistors being in saturation, one of the transistors is in the Rdson region with a very low average voltage, typically less than a threshold voltage. Because of this, the current sink of transistors 72 and 74 is lower than the theoretical level of Iin. However, with clamping transistors 75 and 76 respectively connected in parallel with transistors 72 and 74, the current deficit is absorbed and the maximum om and opsignal swings are clamped to well-defined levels. Oscillation in ring oscillator circuit 46 occurs, because there are five comparator cells 60–63 connected with their respective om and op outputs connected to corresponding ip and im inputs in respective next in order comparator cells. The inputs and outputs between individual comparator cells are not cross-connected and transistors 70 in the respective comparator cells 60–63 determine the switching in ring oscillator circuit 46. The voltage drop across each transistor 70 is sufficient to permit corresponding transistors 71 and 73 to act as differential input transistors according to a comparator function in which one input rises as the other input drops. A dependency on such a coupled switching action prevents independent switching transitions on either the ip or im input nodes. When the ip input rises without im changing, the cc node will also rise, although not to the same extent as the ip node rise. When the im node begins to fall, the current changes from passage through transistor 71 to passage through transistor 73 and the output levels change correspondingly. In particular, the op output will rise until it reaches the Vgson potential of transistor 76 which clamps the op voltage. The om output level correspondingly approaches ground potential. The use of clamping transistors 75 and 76 permits ring oscillator circuit 46 to control output drive circuit 47 which includes level shift circuitry which requires provision of well-defined input levels from ring oscillator circuit 46 in order to operate. The clamping transistors 75 and 76 eliminate mismatches due to high currents into the cc1 node tending to interfere with current matching for transistors 71 and 73 and non-oscillation of ring oscillator circuit 46 at higher current levels at cc1 node. As ring oscillator circuit oscillation is ensured because current into node cc1 necessarily matches the current shunted to ground via clamping transistors 75 and 76, rigorous power supply filtering on the cc1 node can be implemented, particularly with respect to transistors 37, 41 and 42 as discussed in connection with FIG. 3.

Figure 6:
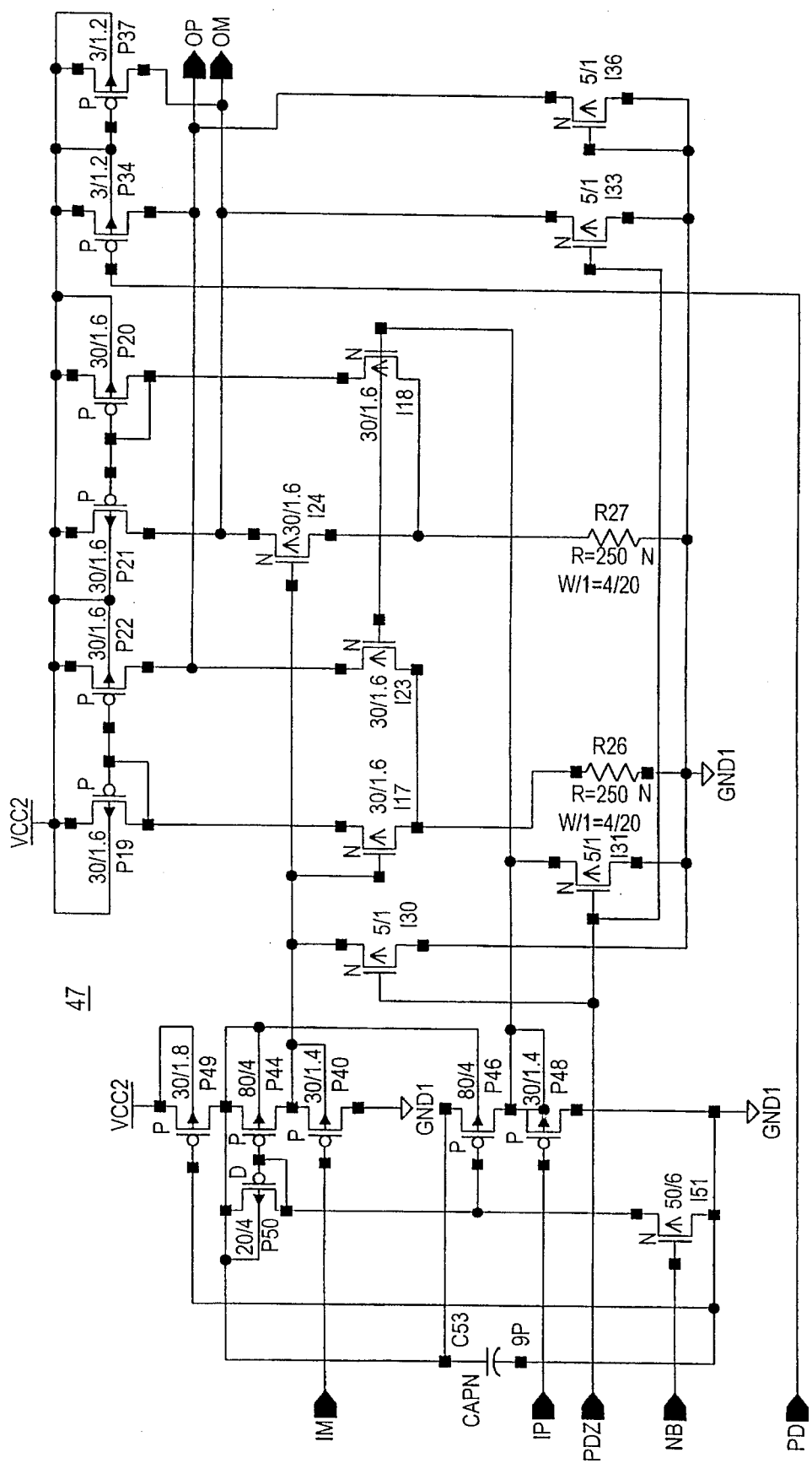
FIG. 6 is a circuit diagram of an output drive circuit for the voltage controlled oscillator circuit according to the present invention.

FIG. 6 is a circuit diagram of an output drive circuit 47 for the voltage controlled oscillator circuit 22 according to the present invention. Output drive circuit 47 accomplishes level shifting of the output signal from ring oscillator circuit 46 to produce a rail to rail voltage. Output drive circuit 47 ensures that the om and op signals output from voltage controlled oscillator circuit 22 are translated into CMOS signals. The CMOS outputs are vo and voz signals which are input to buffer circuit 48.

What is claimed is:

1. A voltage controlled oscillator circuit comprising:

interconnected differential comparator cells each including first and second source connected p-channel transistor circuits having first and second gate inputs serving respectively as differential comparator inputs and first and second source connected n-channel transistor circuits, said first and second p-channel transistor circuits connected at their respective drains to the corresponding drains of first and second n-channel transistor circuits, a biasing transistor circuit connected to the sources of said first and second source connected p-channel transistor circuits, and first and second clamping circuits respectively connected with respective ones of the sources and drains of said first and second n-channel transistor circuits, said voltage oscillator circuit including first and second outputs respectively connected to the drains of said first p-channel transistor circuit and said first n-channel transistor circuit, and to the drains of said second p-channel transistor circuit and said second n-channel transistor circuit, further comprising a filter circuit for filtering a bias current applied to said biasing transistor circuit.

2. The voltage controlled oscillator circuit according to claim 1 wherein said filter circuit has a plurality of transistor stages to permit tuning to a selected level of noise immunity.

3. A differential comparator voltage controlled oscillator circuit, comprising:

series connected differential comparator cells which are settable to operate at a selected common frequency over a predetermined operable frequency range;

a current controlled bias circuit for applying a common biasing voltage to each of said series connected differential comparator cells; and a filter for removing noise from electric current provided to said current controlled bias circuit.

* * * * *